United States Patent
Lim

(10) Patent No.: US 9,171,979 B2
(45) Date of Patent: Oct. 27, 2015

(54) BATTERY AND SOLAR METHOD FOR MANUFACTURING THE SAME

(75) Inventor: Chin Woo Lim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 81 days.

(21) Appl. No.: 13/380,313

(22) PCT Filed: Nov. 1, 2010

(86) PCT No.: PCT/KR2010/007615
§ 371 (c)(1),
(2), (4) Date: Dec. 22, 2011

(87) PCT Pub. No.: WO2011/053077
PCT Pub. Date: May 5, 2011

(65) Prior Publication Data
US 2012/0199191 A1 Aug. 9, 2012

(30) Foreign Application Priority Data

Oct. 30, 2009 (KR) .................. 10-2009-0104468

(51) Int. Cl.
*H01L 31/02* (2006.01)
*H01L 31/0392* (2006.01)
*H01L 31/046* (2014.01)

(52) U.S. Cl.
CPC .... *H01L 31/03928* (2013.01); *H01L 31/03923* (2013.01); *H01L 31/046* (2014.12); *Y02E 10/541* (2013.01)

(58) Field of Classification Search
CPC .................................................. H01L 31/0024
USPC ....................................................... 136/249
See application file for complete search history.

(56) References Cited

U.S. PATENT DOCUMENTS

| | | |
|---|---|---|
| 4,892,592 A | 1/1990 | Dickson et al. |
| 5,676,766 A | 10/1997 | Probst et al. |
| 2002/0172313 A1 | 11/2002 | Ogura et al. |
| 2007/0254456 A1 | 11/2007 | Maruyama et al. |
| 2009/0065060 A1 | 3/2009 | Yonezawa et al. |
| 2009/0111206 A1 | 4/2009 | Luch |
| 2009/0242022 A1 | 10/2009 | Yonezawa |

(Continued)

FOREIGN PATENT DOCUMENTS

| | | |
|---|---|---|
| CN | 101064247 A | 10/2007 |
| EP | 1933343 A1 | 6/2008 |

(Continued)

OTHER PUBLICATIONS

International Search Report in International Application No. PCT/KR2010/007615, Nov. 1, 2010.

(Continued)

*Primary Examiner* — Susan D Leong
(74) *Attorney, Agent, or Firm* — Saliwanchik, Lloyd & Eisenschenk

(57) ABSTRACT

A solar battery according to the embodiment of the present invention includes a rear electrode formed on a substrate and separated by a first through-hole; a light absorbing layer formed on the rear electrode including the first through-hole; a second through-hole exposing the rear electrode through the light absorbing layer; a buffer layer formed on the upper surface and the side surface of the light absorbing layer; a front electrode layer formed on the buffer layer; and a connection wiring extending from the front electrode layer and formed within the second through-hole.

10 Claims, 4 Drawing Sheets

(56) References Cited

U.S. PATENT DOCUMENTS

| | | |
|---|---|---|
| 2010/0024877 A1 | 2/2010 | Duerr et al. |
| 2010/0288329 A1 | 11/2010 | Hong et al. |

FOREIGN PATENT DOCUMENTS

| | | |
|---|---|---|
| JP | H09-503346 A | 3/1997 |
| JP | 2002-094089 A | 3/2002 |
| JP | 2002-343564 A | 11/2002 |
| JP | 2005-032917 A | 2/2005 |
| JP | 2007-123532 A | 5/2007 |
| JP | 2007-317858 A | 12/2007 |
| JP | 2007-317885 A | 12/2007 |
| KR | 10-2009-0068110 A | 6/2009 |

OTHER PUBLICATIONS

Supplementary European Search Report dated Aug. 14, 2013 in European Application No. 10827161.0, filed Nov. 1, 2010.

Notice of Allowance dated Jul. 30, 2012 in Korean Application No. 10-2009-0104468, filed Oct. 30, 2009.

Office Action, dated Mar. 21, 2014, in Chinese Application No. 201080049592.6.

BATTERY AND SOLAR METHOD FOR MANUFACTURING THE SAME

CROSS-REFERENCE TO RELATED APPLICATION

This application is the U.S. national stage application of International Patent Application No. PCT/KR2010/007615, filed Nov. 1, 2010, which claims priority to Korean Application No. 10-2009-0104468, filed Oct. 30, 2009, the disclosures of each of which are incorporated herein by reference in their entirety.

BACKGROUND OF THE INVENTION

1. Technical Field

The embodiment of the present invention relates to a solar battery and a method for manufacturing the same.

2. Description of the Related Art

Recently, as demand for energy increases, a solar battery for converting solar-light energy into electric energy has been developed.

In particular, CIGS-base solar that is a hetero junction device of a of structure of substrate including a metal-back-electrode layer, a p-type CIGS-base-light absorbing layer, a buffer layer, a n-type window layer has widely been used.

The rear electrode layer and the n-type window layer may be connected through a through-hole formed in the light absorbing layer and the buffer layer.

Since the through-hole is formed by a mechanical and laser patterning process, there keep particle in the through-hole, thereby providing a possibility of generation of a leakage current.

In addition, the light absorbing layer is formed at high temperatures, so that a rigid substrate which can withstand a high-temperature process is used. Therefore, the substrate may have a limitation in use.

The embodiment of the present invention provides a solar battery and a method of manufacturing the same.

SUMMARY OF THE INVENTION

The embodiment in accordance with the present invention includes a rear electrode formed on a substrate and separated by an first through-hole; an light absorbing layer formed on the rear electrode including the first through-hole; an second through-hole exposing the rear electrode through the light absorbing layer; a buffer layer formed on the surface of the light absorbing light; an front electrode layer formed on the buffer layer; and an connection wiring extending from the front electrode layer and formed within the second through-hole.

A method of manufacturing a solar battery according the embodiment of the present invention includes forming a rear electrode layer on a support substrate and forming a first through-hole to separate the rear electrode each other; forming an light absorbing layer on a carrier substrate; forming an second through-hole passing through the light absorbing layer to have the position adjacent to the first through-hole; bonding the support substrate and the carrier substrate to form the light absorbing layer on the rear electrode layer; removing the carrier substrate to expose the light absorbing layer; forming a buffer layer on the light absorbing layer; forming an front electrode layer on the buffer layer and forming an connection wiring within a second through-hole.

DESCRIPTION OF THE PREFERRED EMBODIMENTS

Figure 1:
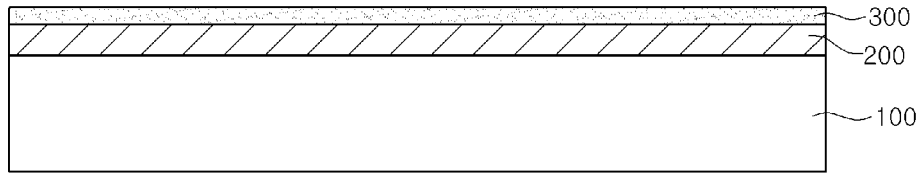
FIG. 1 to FIG. 10 is a cross-sectional view showing a method for manufacturing a solar battery according the embodiment of the present invention.

In the embodiment of the present invention, in case that each substrate, a layer, a film, electrode and the like is formed "on" or "under" each substrate, the layer, the film or the electrode, " on" and "under" mean including "directly" or " indirectly" through other components In addition, a criteria of "top" and "bottom" will be described based on the drawings. A size of each component in the drawings may be exaggerated for clear description and does not means the size actually applied thereto.

FIG. 1 to FIG. 10 is a cross-sectional view showing a method for manufacturing a solar battery according the embodiment of the present invention.

Referring to FIG. 1, the rear electrode layer 200 and a conductive adhesive layer 300 are formed on the support substrate 100.

The support substrate 100 is used as glass and a ceramic substrate, a metal substrate, a polymer substrate and the like may also be used.

For example, the glass substrate may use sodalime glass or high strained point soda glass. The metal substrate uses the substrate including stainless steel or titanium and a polymer substrate may use polymide.

The support plate 100 may be transparent. In addition, the substrate 100 may be rigid or flexible.

In particular, the present embodiment provides a flexible substrate 100. For example, the support plate 100 may use polymer series such as plastic and the flexible substrate of stainless steel (SUS) series.

The rear electrode layer 200 and the like may be made of a conductor such metal and the like.

For example, the rear electrode pattern may be formed using molybdenum (Mo) as a target by a sputtering process.

This is why molybdenum (Mo) has a high electrical conductivity, a ohmic junctions and a high temperature stability under Se atmosphere.

Molybdenum (Mo) thin film, which is the rear electrode layer, must have an lower specific resistance as the electrode and must provide excellent adhesive to the substrate 100 so as not to generate a peeling phenomenon caused by the difference in coefficient of thermal expansion.

Through not shown in the drawings, the rear electrode pattern 200 may be formed as at least one layer. When the rear pattern 200 is formed as a plurality of layers, a layers composed of the rear electrode pattern may be formed as different materials.

The adhesive layer 300 is formed on the rear electrode layer 200.

The conductive adhesive layer 300 may be a conductive adhesive.

For example, the conductive adhesive layer 300 may a adhesive material with which metal, resin and frit such as carbon, aluminum and tungsten is mixed.

The conductive adhesive layer 300 is $1 \times 10^{-5} \sim 10 \times 10^{-5}$ in resistivity and is connected electrically to the rear electrode layer 200. The conductive adhesive layer may be formed as 0.5 to 2 μm in range of thickness.

Figure 2:
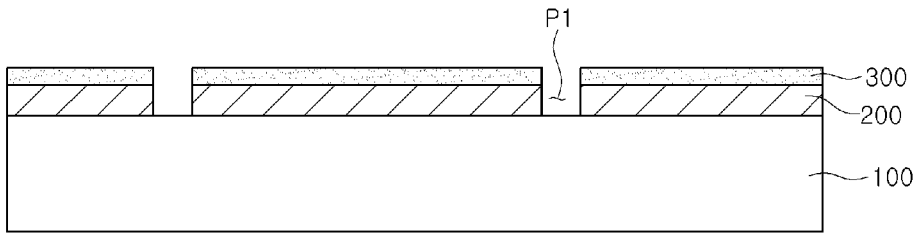

Referring to FIG. 2, a first through-hole passing through the rear electrode layer 200 and the conductive adhesive 300 is formed. The through-hole P1 enables exposure of the upper surface of the support plate 100.

The rear electrode 200 and the conductive adhesive layer 300 may be divided into several by the first through-hole P1.

The rear electrode layer 200 and the conductive 300 may disposed in a stripe or in matrix form by the first through-hole P1 and correspond to each cell.

Meanwhile, the separation pattern 200 is not limited to the form and may be formed as various forms.

Figure 3:
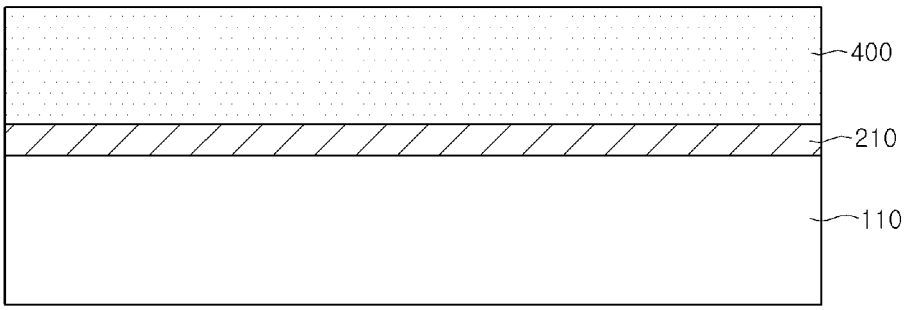

Referring to FIG. 3, a sub-electrode layer 210 and the light absorbing layer 400 is formed on the carrier substrate 110.

The support substrate 110 is made of glass and a ceramic substrate, a metal substrate, a polymer substrate and the like may also be used.

The carrier substrate 100 may use a rigid substrate.

For example, the carrier plate 100 may use soda lime glass, non-alkali glass and low-alkali glass may be used.

The carrier substrate 100 can be relatively thickly formed as compared to the support substrate 100.

For example, the support plate 100 and the carrier substrate 110 may be formed to have a thickness of 1:3~10.

This is why the carrier substrate 110 has a thick and solid property enough to withstand the high temperature process by formation of the light absorbing layer at the high temperature.

The sub-electrode layer 210 is formed on the carrier substrate 110. The rear electrode layer 210 may be made of a conductor such as metal and like.

The sub-electrode layer 210 must provide a excellent adhesive property to the carrier substrate 110 so as not to generate a peeling phenomenon caused by the differences in thermal expansion coefficient.

For example, the sub-electrode layer 210 may be formed using molybdenum(Mo) as target by a sputtering process.

Meanwhile, the sub-electrode layer 210 may not be formed.

The light absorbing layer 400 is formed on the sub-electrode layer 210.

The light absorbing layer 400 may be made of base compound.

In more detail, the light absorbing layer 400 includes copper-indium-gallium-selenide-base-(Cu(In, Ga)Se2, CIGS-base) compound.

In this contrast, the light absorbing layer 400 may contains cooper-indium-selenide base compound (CuInSe2, CIS base) or copper-gallium-selenide-base (CuGaSe2, CIS base).

In order to the light absorbing layer 400, CIG base metal precursor is formed on the rear electrode pattern 210 using a copper target, an indium target and a gallium target.

Subsequently, a metal precursor film reacts with selenide (Se) to form CIGS base light absorbing layer 400 using a selenization process.

In addition, the light absorbing layer 400 may forms copper, indium, gallium, selenide (Cu, In, Ga, Se) using co-evaporation deposition method.

The light absorbing layer 400 receives an incident light from outside and converts the light into electrical energy.

The light absorbing layer 400 generates a light electromotive force by a photoelectric effect.

The light absorbing layer 400 is formed at an high temperature of more than 1000° C. thereby improving a crystallinity.

Figure 4:
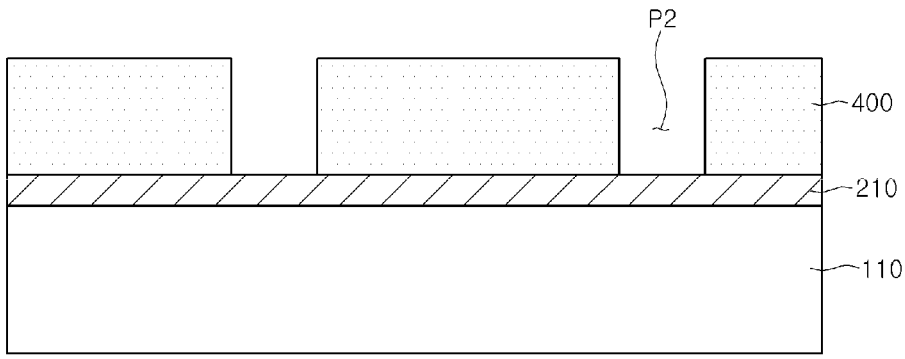

Referring FIG. 4, the second through-hole P2 passing through the light absorbing layer 400 is formed. The through-hole P1 enables exposure of the upper surface of the support plate 210.

The light absorbing layer 400 is separated from the neighboring light absorbing layer and may be separated as cell unit.

Figure 5:
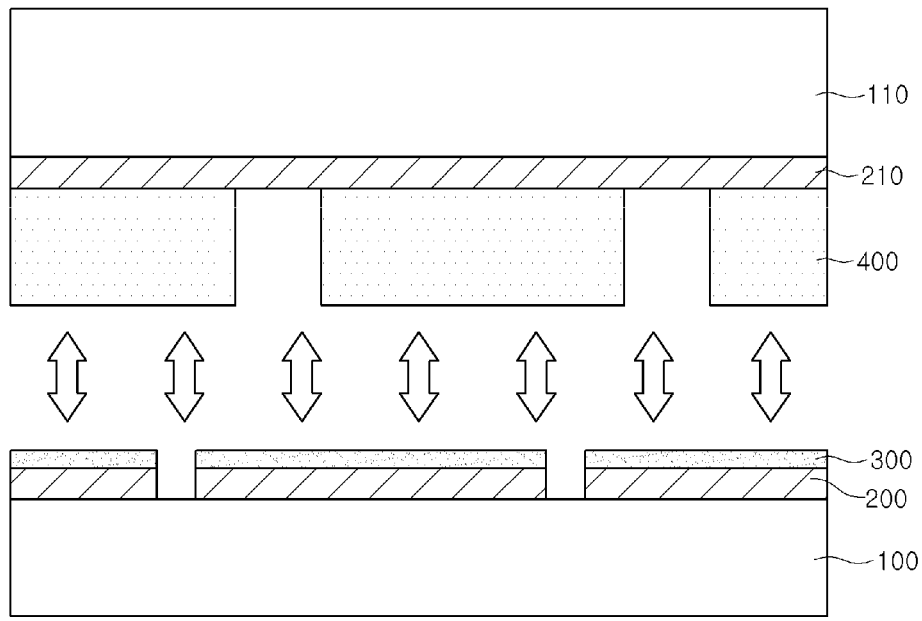
Figure 6:
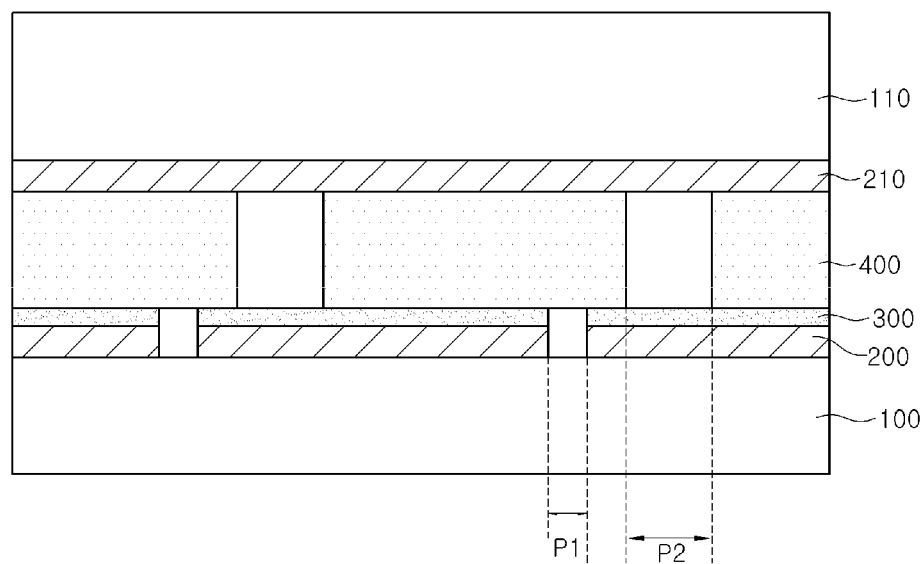

Referring to FIG. 5 and FIG. 6, a bonding process is performed for the support plate 100 and the carrier substrate 110.

The support 100 and the carrier substrate 110 is integrally formed by the bonding process.

The bonding process may proceed after positioning to face the conductive adhesive layer 300 formed on the support plate 100 and the light absorbing layer 400 of the carrier substrate 110.

In particular, heat and pressure is applied while performing the bonding process to improve bonding strength of the support plate 100 and the carrier substrate 110.

The light absorbing layer 400 may be formed on the rear electrode layer 200 by the conductive adhesive layer 300.

Figure 7:
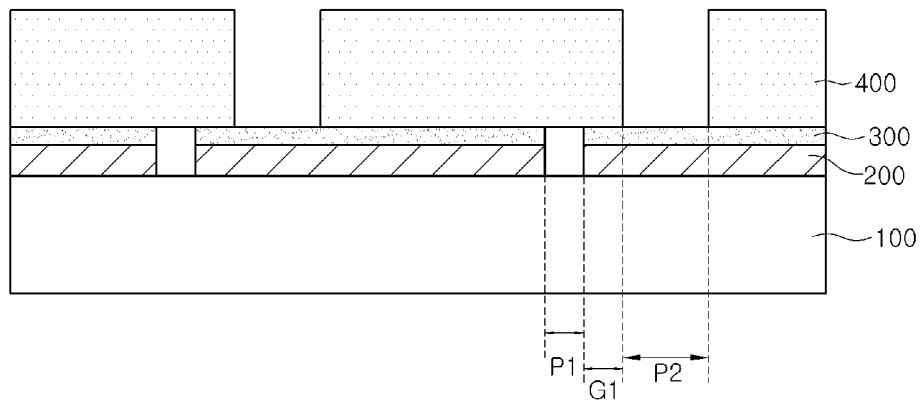

Referring to FIG. 7, the carrier substrate 110 and the sub-electrode layer 210 is removed, so that the light absorbing layer may be exposed.

The carrier substrate 100 and the sub-electrode layer 210 are removed from the light absorbing layer 400 by a lift-off.

Therefore, the rear electrode layer 200, the conductive adhesive layer 300 and the light absorbing layer 400 is laminated on the supporting substrate 100.

Since the conductive adhesive layer 300 is a conductive material, the rear electrode 200 and the light absorbing layer 400 may be electrically connected.

In addition, the first through-hole P1 of the rear electrode layer 200 and the second through-hole P2 of the light absorbing layer 400 may be formed adjacent to each other.

For example, the first through-hole p1 and second through-hole P2 have about 80±20 μm in a first gap G1.

As stated above, the light absorbing layer 400 is bonded to the support plate 100 after forming a separate carrier substrate 110 to form the light absorbing layer 400 on the rear electrode layer 200.

In this way, the high-temperature process for forming the light absorbing layer does not proceed to the support plate 100, thereby preventing a defect of the support substrate 100.

In addition, the support substrate 110 is not applied to the high-temperate process, so that the support plate 100 can be to be lightweight and slim.

In addition, the light absorbing layer 400 is formed on the carrier substrate 110 to enable the progress of the high-temperature process, thereby improving the crystallization of CIGS including the light absorbing layer 400.

In this way, electrical property for the light absorbing layer 400 may be improved.

Figure 8:
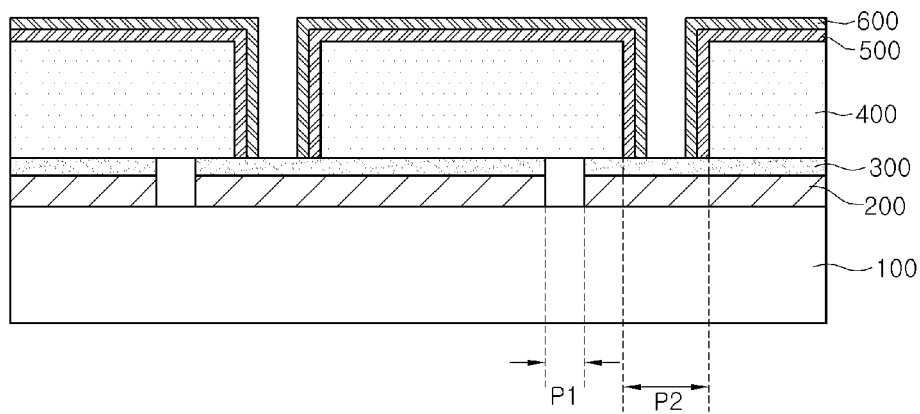

Referring to FIG. 8, the buffer layer 500 and an high-resistance buffer layer 600 are stacked along the surface of the light absorbing layer 400.

The buffer 500 and the high-resistance buffer layer 600 is selectively formed only on the upper surface and the side surface of the light absorbing layer 400 to selectively expose a portion of the conductive adhesive layer 300 that is the bottom surface of the second through-hole P2.

For example, after forming the buffer layer 500 along the surface profile of the light absorbing 400 and the second through-hole P2, the high-resistance buffer layer 600 is formed along the surface profile of the buffer layer.

In addition, a scribing process may be executed so as to expose the conductive adhesive layer 300 that is the bottom surface of the second through-hole P2. The scribing process may perform using a laser and mechanical process.

In this case, the second through-hole P2 may expose the surface of the conductive adhesive layer 300, but may be formed to expose the surface of the rear extrude adhesive layer 200.

The buffer layer 500 may be formed as at least one layer on the light absorbing layer 400. The buffer layer may be formed by the stack on cadmium sulfide (CdS) through CBD process.

In this case, the buffer 500 is an n-type semiconductor layer and the light absorbing layer 400 is a p-type semiconductor layer. Thus, the light absorbing layer 400 and the buffer layer 500 form a p-n junction.

In particular, the buffer layer 500 is formed to surround the upper surface and the side surface of the light absorbing layer 400 to expand the contact area between the buffer layer 500 and the light absorbing layer 400. In this way, p-n junction area is expanded and may provide the highly generating rate of light charge.

In addition, the buffer layer 500 is selectively only on the surface of the light absorbing layer 400 to prevent the leakage current between adjacent cells.

The high-resistance buffer layer 600 performs the a sputtering process that targets zinc oxide(ZnO), so that the zinc oxide layer may further formed on a cadmium sulfide (CdS).

The high-resistance buffer layer 600 may be formed as the transparent electrode on the buffer layer 500.

For example, the high-resistance buffer layer 600 may be formed as any one of ITO, ZnO and i-ZnO.

The buffer layer 500 and the high-resistance buffer layer 600 are disposed between the light absorbing layer 400 and the front electrode formed thereafter.

In other words, the buffer layer 500 and the high-resistance buffer layer in the middle of two materials may be necessary to form a good junction because of a significant size difference of an energy band gap and a lattice constant.

In this embodiment, the two buffer layer 500 is formed on the light absorbing layer 400, but is limited to this and the buffer layer 500 may be formed as only one layer.

Figure 9:
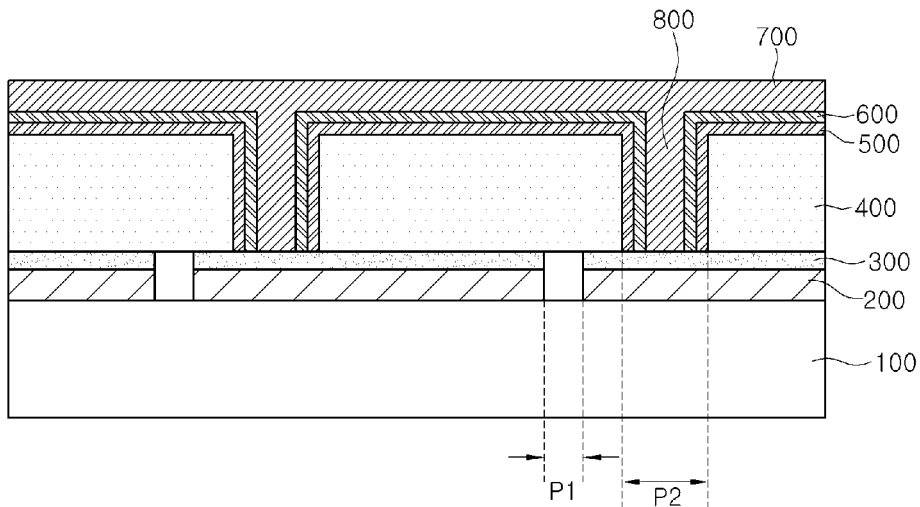

Referring FIG. 9, the transparent conductive material is laminated on the high-resistance buffer layer 600 including the second through-hole P2 to form the front electrode layer 700.

When the front electrode 700 is formed, the transparent conductive material is also inserted into the second through-hole P2 to form connection wiring 800. That is, the connection wiring 800 may contact with the conductive adhesive layer 300.

The front electrode layer 700 performs the sputtering process to form aluminum (Al), or alumina (Al2O3) doped zinc oxide.

The upper electrode 700 is a window layer performing the p-n junction the light absorbing layer, wherein the window layer serves as a function of the transparent electrode of a front surface of the solar battery to be formed as zinc oxide (ZnO) having a high light transmittance and high electric conductivity.

Therefore, the electrode having a low resistance may be formed by doping aluminum or alumina on zinc oxide.

A zinc oxide thin film that is the upper electrode 700 includes a method for depositing ZnO target using RF sputtering method, a reactive sputtering using Zn target and a metal-organic chemical vapor deposition method.

In addition, ITO (Indium Thin Oxide) having an excellent electro-optical characteristics may form a double structure deposited on zinc oxide thin film.

Each cell is connected to each other by the connection wiring 800. That is, the connection wiring 800 may electrically and physically connects the rear electrode 200 and the front electrode layer 700 of cell adjacent to each other.

Although not shown in Drawings, the connection wiring 800 may keep in direct contact with the rear electrode layer 200 through the second through-hole P2. In a way, the contact property of the connection wiring 800 and the rear electrode layer 200 may be improved.

The buffer layer 500 and the high-resistance buffer layer 600 are formed around the connection wiring 800 to improve the electrical bonding property, thereby providing a desirable current movement.

That is, the buffer layer 500 and the high-resistance buffer layer 600 are disposed between the light absorbing layer 400 and the connection wiring 800 to completely block the generation of the leakage current and a series resistance component is reduced to improve an electrical property.

Figure 10:
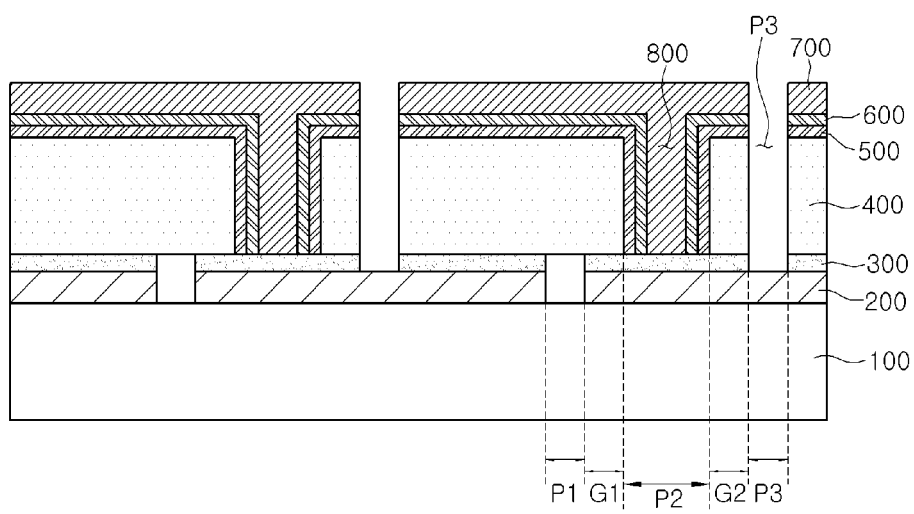

Referring to FIG. 10, the third through-hole P3 passing through the front electrode 700, the high-resistance buffer layer 600, the buffer layer 500 and the light absorbing layer 400 are formed.

The third through-hole P1 may selectively exposes the rear electrode layer 200. The third through-hole P3 may be configured to be adjacent to the second through-hole P2.

For example, the first through-hole P2 and the third through-hole P3 have about 80±20 μm in a first gap G2.

The third through-hole P3 may be formed by a layer irradiation method or a mechanical method such as a tip.

Therefore, the light absorbing layer 400, the buffer layer 500, the high-resistance buffer layer 600 and the front electrode layer 700 may be separates as unit cell.

According to the embodiment of the present invention provides an improved electrical characteristics.

In particular, a CIGS light absorbing layer for generating a photoelectromotive force is patterned as a cell unit and a buffer layer is formed on an exposed surface, thereby preventing a leakage current.

In addition, a photocharge generating rate can be improved the joint area of the light absorbing layer and the buffer layer are expand.

Moreover, after the light absorbing layer is formed separately on the carrier substrate, a support substrate in which the rear electrode layer is formed may be bond to the light absorbing layer.

Accordingly, the support substrate can use various substrates, that is, a hard or flexible substrate. In addition, the substrate may be slim and lightweight to be applicable to various areas.

Moreover, the light absorbing layer is formed on the carrier substrate and enables a high-temperature process, so that the degree of crystalinity of the light absorbing layer may be improved.

In this way, the electrical property for the light absorbing layer may be improved.

The solar battery according to the embodiment is applicable to various substrates, that is, a hard substrate or a flexible substrate.

It is appreciated that can be carried out in other specific forms without changing a technical idea or essential characteristics by one having ordinary skilled in the art to which the present invention pertains to. Therefore, embodiments described above are for illustration purpose in all respect but not limited to them. The scope of the present invention is represented by claims described below rather than the detailed description, and any change and variations derived from the meaning, the scope and the concept of equality of claims should be interpreted to be included to the scope of the present invention.

In addition, although the preferred embodiments of the present invention are shown and described above, the present invention is not limited to above-described specific embodiment and is variously modified by one skilled in the art without the gist of the present invention claimed in the claim, such that the modified embodiment is not to be understood separately from technical ideas or views of the present invention.

What is claimed is:

1. A solar battery comprising;
a substrate;
a rear electrode on a top surface of the substrate;
a light absorbing layer on the rear electrode including a first through-hole;
a second through-hole exposing the rear electrode through the light absorbing layer;
a buffer layer on a top surface and a lateral side surface of the light absorbing layer;
a front electrode layer on the buffer layer; and
a connection wiring extending from the front electrode layer and formed within the second through-hole;
wherein the buffer layer is disposed between, in a first direction parallel to the surface of the substrate, the light absorbing layer and the connection wiring,
wherein the rear electrode is separated by the first through-hole, and
wherein the connection wiring is in direct contact with the buffer layer in the second through-hole.

2. The solar battery of claim 1, further comprising a conductive adhesive layer on the rear electrode.

3. The solar battery of claim 1, wherein
the substrate includes a flexible substrate or a rigid substrate.

4. The solar battery of claim 1, wherein
the substrate includes a polymer substrate or a stainless steel substrate.

5. The solar battery of claim 1, wherein
the buffer layer comprises a first buffer layer and a high-resistance buffer layer formed on the surface of the first buffer layer.

6. The solar battery of claim 2, wherein
a resistivity of the conductive adhesive layer is $1 \times 10^{-5} \sim 10 \times 10^{-5}$ $\Omega$cm.

7. The solar battery of claim 1, wherein
the first through-hole is formed at intervals of 60 to 100 μm, and
wherein the second through-hole is formed at intervals of 60 to 100 μm.

8. The solar battery of claim 2, wherein
the conductive adhesive layer has a thickness of 0.5 to 2 μm.

9. The solar battery of claim 1, wherein the buffer layer is disposed between the front electrode layer and the light absorbing layer.

10. The solar battery of claim 1, wherein the front electrode layer is directly on the buffer layer.

* * * * *